(12) United States Patent
Lin et al.

(10) Patent No.: US 8,587,058 B2
(45) Date of Patent: Nov. 19, 2013

(54) LATERAL DIFFUSED METAL-OXIDE-SEMICONDUCTOR DEVICE

(75) Inventors: An-Hung Lin, New Taipei (TW); Hong-Ze Lin, Hsinchu (TW); Bo-Jui Huang, Hsinchu (TW); Wei-Shan Liao, Yunlin County (TW); Ting-Zhou Yan, Kaohsiung (TW); Kun-Yi Chou, New Taipei (TW); Chun-Wei Chen, Hsinchu (TW); Ming-Yong Jian, Chiayi County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 41 days.

(21) Appl. No.: 13/342,189

(22) Filed: Jan. 2, 2012

(65) Prior Publication Data

US 2013/0168767 A1  Jul. 4, 2013

(51) Int. Cl.
    *H01L 29/66* (2006.01)
(52) U.S. Cl.
    USPC .............. 257/337; 257/E27.04; 257/E29.013
(58) Field of Classification Search
    CPC ............ H01L 29/7835; H01L 29/0847; H01L 29/42368
    USPC ..................... 257/E27.04, E29.013, 337, 343
    See application file for complete search history.

(56) References Cited

U.S. PATENT DOCUMENTS

| | | | |
|---|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |

(Continued)

*Primary Examiner* — Nikolay Yushin
(74) *Attorney, Agent, or Firm* — Winston Hsu; Scott Margo

(57) ABSTRACT

The present invention provides a lateral diffused metal-oxide-semiconductor device including a first doped region, a second doped region, a third doped region, a gate structure, and a contact metal. The first doped region and the third doped region have a first conductive type, and the second doped region has a second conductive type. The second doped region, which has a racetrack-shaped layout, is disposed in the first doped region, and has a long axis. The third doped region is disposed in the second doped region. The gate structure is disposed on the first doped region and the second doped region at a side of the third doped region. The contact metal is disposed on the first doped region at a side of the second doped region extending out along the long axis, and is in contact with the first doped region.

11 Claims, 4 Drawing Sheets

(56) References Cited

U.S. PATENT DOCUMENTS

| | | |
|---|---|---|
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,593,621 B2 * | 7/2003 | Tsuchiko et al. ............. 257/335 |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,873,011 B1 * | 3/2005 | Huang et al. ................. 257/345 |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 7,808,223 B1 | 10/2010 | Khanna |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2005/0285188 A1 * | 12/2005 | Khemka et al. ............... 257/338 |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |
| 2011/0079849 A1 * | 4/2011 | Yan et al. ...................... 257/343 |

* cited by examiner

US 8,587,058 B2

LATERAL DIFFUSED METAL-OXIDE-SEMICONDUCTOR DEVICE

BACKGROUND OF THE INVENTION

1. Field of the Invention

The present invention relates to a lateral diffused metal-oxide-semiconductor (LDMOS) device, and more particularly, to an LDMOS device with a Schottky diode.

2. Description of the Prior Art

A lateral diffused metal-oxide-semiconductor (LDMOS) device is a kind of popular power semiconductor device. Due to having a planar structure, the LDMOS is easily manufactured and is easily integrated with semiconductor technology, so that the manufacturing cost may be reduced. The LDMOS further has higher breakdown voltage and higher output power so as to be applied in the devices, such as power converter, power amplifier, switch, and rectifier, etc.

In a traditional LDMOS device, an N-type doped drain region and a P-type doped base region are usually disposed in an n-type drift region, and an N-type doped source region is disposed in the P-type doped base region. A gate metal is disposed on the P-type doped base region between the N-type doped source region and the N-type drift region. A source metal is disposed on the N-type doped source region and the P-type doped base region, and is electrically connected to a low voltage end of a power source. A drain metal is disposed on the N-type doped drain region, and is electrically connected to a high voltage end of the power source. Furthermore, a field oxide is disposed on the N-type drift region and between the gate metal and the drain metal, and is used for tolerating high electric field from the high voltage end. As we can know that the P-type doped base region and the N-type drift region in the traditional LDMOS device form a parasitic diode.

Although the parasitic diode provides a reverse current path from source to drain in order to introduce minor charges, the area and the transferring speed of the reverse current path are too small to eliminate the reverse source current rapidly, so that an energy loss of the LDMOS device is generated when switching the LDMOS device. Thus, to eliminate the reverse source current through the parasitic diode cannot satisfy recent requirements. To raise the reverse source current of the LDMOS device is an important objective in this field.

SUMMARY OF THE INVENTION

It is therefore an objective of the present invention to provide a lateral diffused metal-oxide-semiconductor (LDMOS) device to raise the reverse source current of the LDMOS device and save the area of the LDMOS device.

According to a preferred embodiment, the present invention provides an LDMOS device including a substrate, a first doped region, a second doped region, a third doped region, a fourth doped region, a gate structure, and a contact metal. The first doped region is disposed in the substrate, and has a first conductive type. The second doped region is disposed in the first doped region, and has a second conductive type, wherein the second doped region has a racetrack-shaped outline, and the second doped region has a long axis and a short axis. The third doped region is disposed in the second doped region, and has the first conductive type. The fourth doped region is disposed in the first doped region, and has the first conductive type. The gate structure is disposed on the first doped region and the second doped region between the third doped region and the fourth doped region. The contact metal is disposed on the first doped region at a side of the second doped region extending out along the long axis, and is in contact with the first doped region.

According to another preferred embodiment, the present invention provides an LDMOS device including two Schottky diodes, and a plurality of LDMOS units. The Schottky diodes are disposed in parallel with a direction. The LDMOS units are disposed between the Schottky diodes, and the LDMOS units are arranged along the direction.

The LDMOS device in the present invention disposes the contact metal of the Schottky diode on the N-type first doped region at a side of the P-type second doped region extending out along the long axis to effectively utilize the region surrounded by the guard ring without affecting the current and to save the area of the LDMOS device. In addition, the LDMOS device of the present invention may further utilize the built-in Schottky diode to raise the current of the reverse current path from the source to the drain so as to accelerate the speed of introducing the reverse source current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
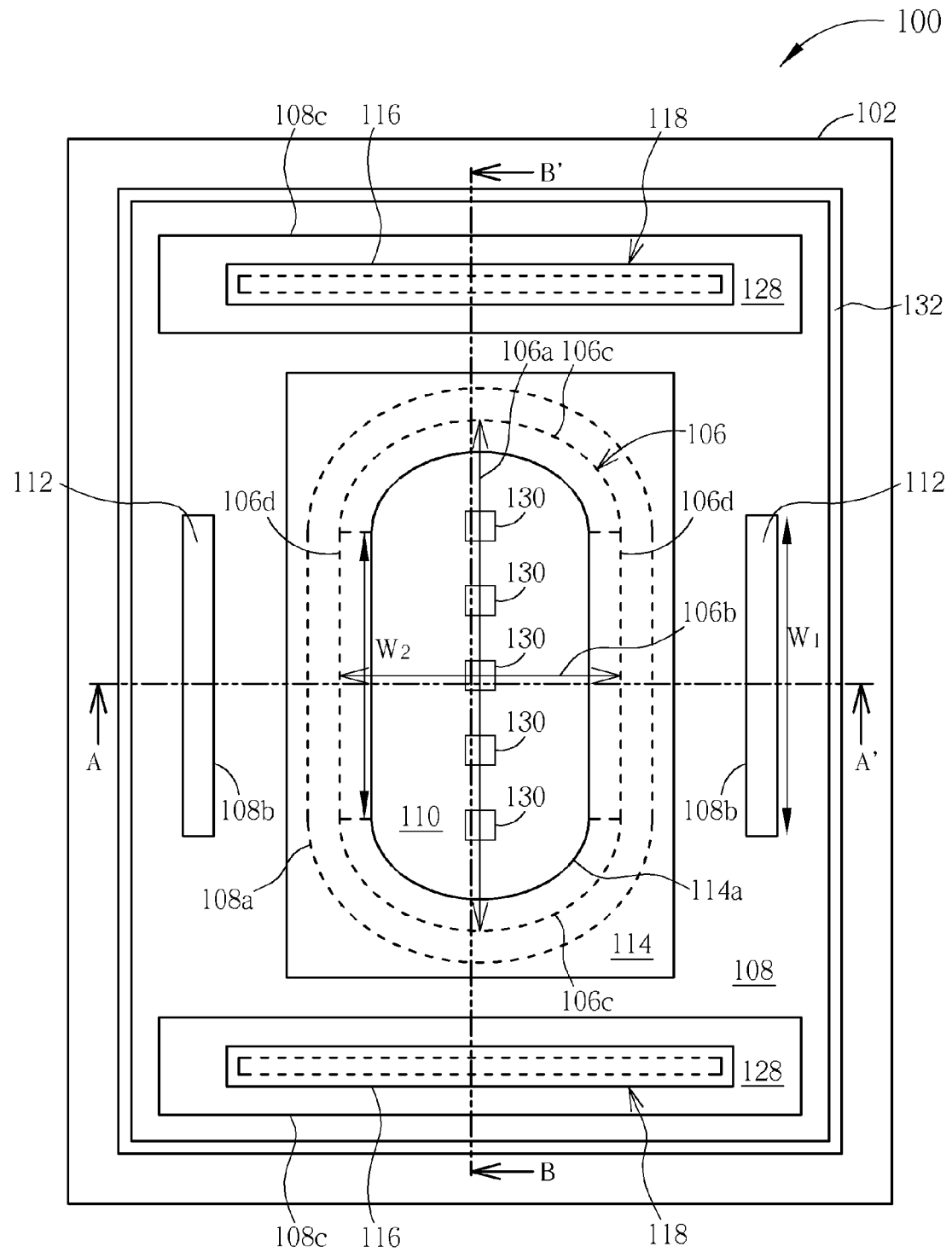
FIG. 1 is a schematic diagram illustrating a top view of a lateral diffused metal-oxide-semiconductor (LDMOS) device according to a first preferred embodiment of the present invention.
Figure 2:
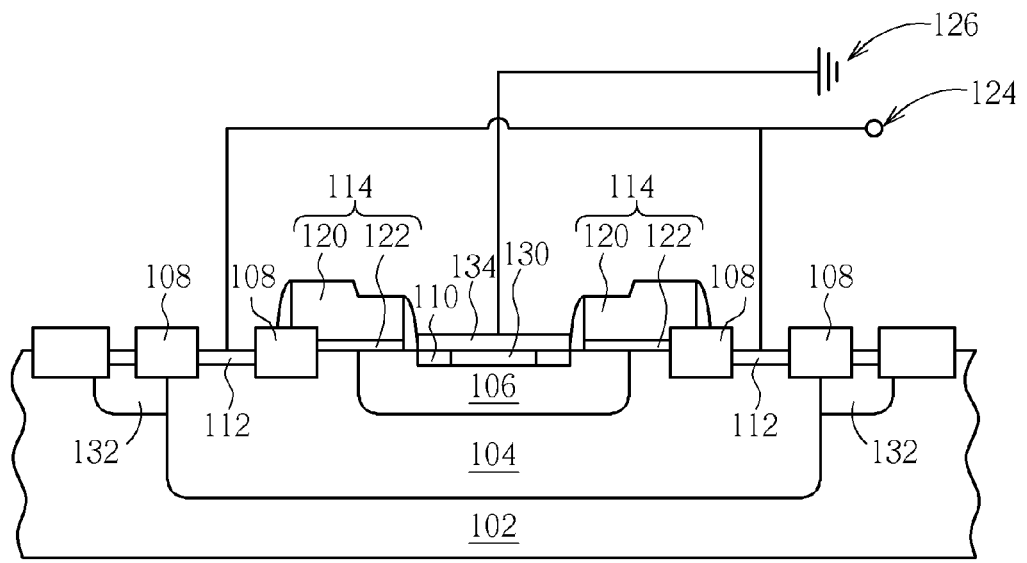
FIG. 2 is a schematic diagram illustrating a cross-sectional view of FIG. 1 along a cutting line A-A'.
Figure 3:
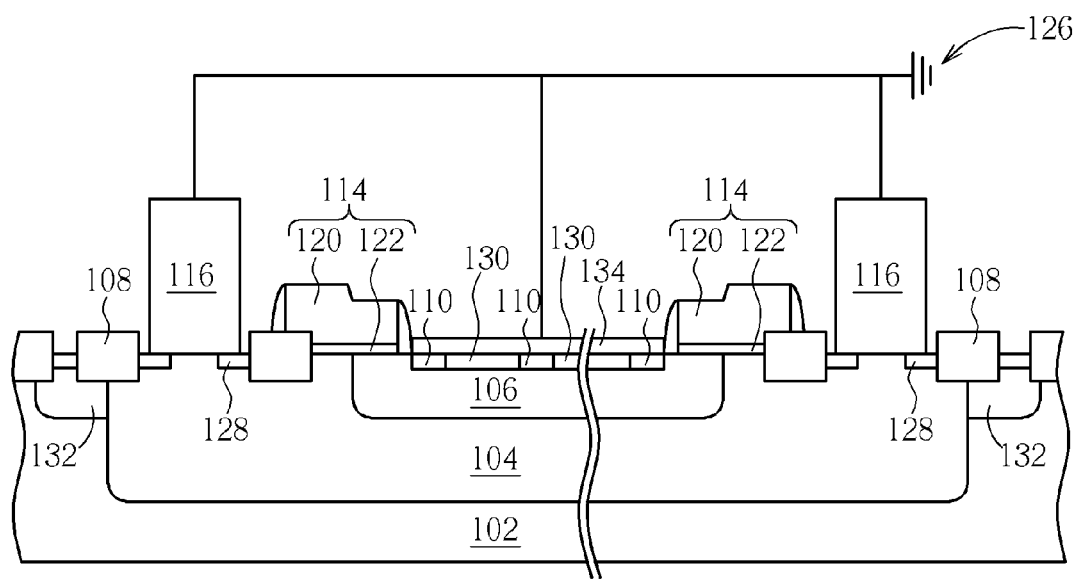
FIG. 3 is a schematic diagram illustrating a cross-sectional view of FIG. 1 along a cutting line B-B'.

Please refer to FIG. 1 through FIG. 3. FIG. 1 is a schematic diagram illustrating a top view of a lateral diffused metal-oxide-semiconductor (LDMOS) device according to a first preferred embodiment of the present invention, wherein FIG. 2 is a schematic diagram illustrating a cross-sectional view of FIG. 1 along a cutting line A-A', and FIG. 3 is a schematic diagram illustrating a cross-sectional view of FIG. 1 along a cutting line B-B'. As shown in FIG. 1 through FIG. 3, the LDMOS device 100 includes a substrate 102, a first doped region 104, a second doped region 106, a field oxide layer 108, a third doped region 110, two fourth doped regions 112, a gate structure 114, and a contact metal 116. The first doped region 104, the third doped region 110, and the fourth doped region have a first conductive type, and the substrate 102 and the second doped region 106 have a second conductive type different from the first conductive type. In this embodiment, the first conductive type and the second conductive type are respectively N type and P type. The first conductive type and the second conductive type in the present invention are not limited to this, and may be exchanged. Furthermore, the substrate 102 may be a silicon wafer, but the present invention is not limited herein. Also, the substrate 102 is not limited to have the same conductive type as the second doped region 106. The substrate 102 of the present invention may have conductive type different from the second doped region 106 and the same as the first doped region 104.

In this embodiment, the N-type first doped region 104 is disposed in the P-type substrate 102, and the P-type second doped region 106 is disposed in the N-type first doped region 104. The P-type second doped region 106 has a racetrack-shaped outline, and the P-type second doped region 106 has a long axis 106a, a short axis 106b, two curved portions 106c disposed opposite to each other, and two straight portions 106d disposed opposite to each other. The long axis 106a is perpendicular to the short axis 106b, and is parallel with each straight portion 106d. The curved portions 106c are respectively disposed at two ends of the long axis 106a, and the straight portions 106d are respectively disposed at two ends of the short axis 106b. Two ends of one of the straight portions 106d are connected to one ends of the curved portions 106c, and two ends of the other one of the straight portions 106d are connected to the other one ends of the curved portions 106c, so that the straight portions 106d and the curved portions 106c form the racetrack-shaped outline. Furthermore, the gate structure 114 is disposed on the N-type first doped region 104 and the P-type second doped region 106, and the gate structure 114 has a first opening 114a corresponding to the P-type second doped region 106, so that the first opening 114a also has the racetrack-shaped outline. The gate structure 114 includes a gate conductive layer 120 and a gate insulating layer 122 disposed between the gate conductive layer 120 and the P-type substrate 102. The N-type third doped region 110 is disposed in the P-type second doped region 106, and the N-type third doped region 110 is formed in the P-type second doped region 106 through the first opening 114a so as to have the racetrack-shaped outline. Furthermore, the P-type second doped region 106 and the gate structure 114 surround the N-type third doped region 110. The field oxide layer 108 is disposed on a top surface of the P-type substrate 102, and has a second opening 108a, two third openings 108b, and two fourth openings 108c. The second opening 108a corresponds to the positions of the gate structure 114 and the P-type second doped region 106 so as to have the racetrack-shaped outline. Also, the gate structure 114 is further extended toward an outside of the P-type second doped region 106 and is extended onto the N-type first doped region 104 and the field oxide layer 108. Thus, the field oxide layer 108 may be utilized to avoid electric field in the N-type first doped region 104 damaging the gate insulating layer 122. Each third opening 108b is slit-shaped, and corresponds to a position of each N-type fourth doped region 112 respectively. Each fourth opening 108c is also slit-shaped, and corresponds to a position of Schottky diode 118 respectively. As we can see from the above-mentioned, the N-type first doped region 104 may be regarded as a drain of the LDMOS device 100, and is electrically connected to a high voltage end 124. The P-type second doped region 106 may be regarded as a base of the LDMOS device 100. The N-type third doped region 110 may be regarded as a source of the LDMOS device 100, and is electrically connected to a low voltage end 126. The gate conductive layer 120 may be regarded as a gate of the LDMOS device 100.

Furthermore, the third openings 108b are disposed at two sides of the short axis 106b of the P-type second doped region 106. Accordingly, the N-type fourth doped regions 112 formed through the third openings 108b are respectively disposed in the N-type first doped region 104 at two sides of the P-type second doped region 106 extending out along the short axis 106b, and each N-type fourth doped region 112 is also slit-shaped and parallel with the long axis 106a. Thus, the gate structure 114 is disposed on the P-type second doped region 106, the N-type first doped region 104 and a part of the field oxide layer 108 between the N-type third doped region 110 and the N-type fourth doped region 112. In this embodiment, a width $W_1$ of each N-type fourth doped region 112 in a direction parallel with the long axis 106a is larger than a width $W_2$ of each straight portion 106d in the direction parallel with the long axis 106a, and a position of the two ends of each straight portion 106d projected along a direction parallel with the short axis 106b on each N-type fourth doped region 112 is disposed between two ends of each N-type fourth doped region 112. Accordingly, the straight portions 106d of the P-type second doped region 106 disposed between the N-type first doped region 104 and the N-type third doped region 110 and under the gate structure 114 may be regarded as effective channel regions of the LDMOS device 100. Furthermore, the N-type fourth doped region 112 is electrically connected to the high voltage end 124, and the N-type first doped region 104 is electrically connected to the high voltage end 124 through the N-type fourth doped region 112.

In other embodiments of the present invention, the width $W_1$ of each N-type fourth doped region 112 in the direction parallel with the long axis 106a also may be the same as the width $W_2$ of each straight portion 106d in the direction parallel with the long axis 106a, so that one end of the N-type fourth doped region 112 and one end of the straight portion 106d are disposed in a line parallel with the short axis 106b, and the other end of the N-type fourth doped region 112 and the other end of the straight portion 106d are disposed in a line parallel with the short axis 106b. In addition, the field oxide layer 108 may have only one second opening 108b, and the LDMOS device 100 also may have only one N-type fourth doped region 112. Furthermore, the N-type first doped region 104 also may be regarded as the source and electrically connected to the low voltage end, and the N-type third doped region 110 may be regarded as the drain and electrically connected to the high voltage end. Moreover, since the straight portions 106d disposed between the N-type first doped region 104 and the third doped region 110 is regarded as the effective channel regions, the gate structure 114 also may be only disposed on the straight portions 106d, and may not be disposed on the curved portions 106c.

In addition, the fourth openings 108c are disposed at two sides of the long axis 106a of the P-type second doped region 106 respectively, and the contact metals 116 are respectively disposed on the N-type first doped region 104 at two sides of the P-type second doped region 106 extending out along the long axis 106a through the fourth openings 108c. Also, each contact metal 116 is in contact with the N-type first doped region 104 to form a Schottky diode 118, and each contact metal 116 is slit-shaped and parallel with the short axis 106b. Each contact metal 116 is regarded as an anode of each Schottky diode 118, and is electrically connected to the low voltage end 126 so as to electrically connect with the source of the LDMOS device 100. The N-type first doped region 104 is regarded as a cathode of the Schottky diode 118, and also is the drain of the LDMOS device 100, so that the cathode of the Schottky diode 118 may be electrically connected to the drain of the LDMOS device 100. Accordingly, in this embodiment, the LDMOS device 100 may utilize the extra built-in Schottky diode 118 to raise the current of the reverse current path from the source to the drain so as to accelerate the speed of introducing the reverse source current. Moreover, a length of the slit-shaped contact metal 116 is determined according to a width of the effective region or the turn-on current of the LDMOS device 100. In other embodiment of the present invention, the field oxide layer 108 may also have only one fourth opening 108c, and the LDMOS device 100 may have only one contact metal 116 disposed on the N-type first doped region 104 at a side of the P-type second doped region 106 extending out along the long axis 106a. Or, the field oxide layer 108 may also have a plurality of fourth openings 108c disposed at the same side of the P-type second doped region 106, and the LDMOS device 100 may have a plurality of contact metals 116 disposed at the same side of the P-type second doped region 106 and parallel with the short axis 106b. Also, the contact metals 116 are arranged in sequence along the direction parallel with the short axis 106b.

In this embodiment, the LDMOS device 100 further includes two P-type fifth doped regions 128, a plurality of P-type sixth doped regions 130, and a guard ring 132. Each P-type fifth doped region 128 is disposed in the N-type first doped region 104 under each contact metal 116, and is in contact with each contact metal 116 respectively to reduce contact resistance between each contact metal 116 and the N-type first doped region 104 and to raise the turn-on current of each Schottky diode 118. The P-type sixth doped region 130 is disposed in the N-type third doped region 110, and penetrates through the N-type third doped region 110 to be in contact with the P-type second doped region 106. Each P-type sixth doped region 130 may be utilized to reduce the contact resistance between the source metal 134 on the N-type third doped region 110 and the N-type third doped region 110. Furthermore, the P-type sixth doped regions 130 are arranged sequentially along the long axis 106a. The present invention is not limited to this arrangement. The guard ring 132 is a P-type doped region disposed in the P-type substrate 102 and surrounding the N-type first doped region for avoiding the affect of the electric field in the N-type first doped region 104 to the external devices.

It should be noted that the LDMOS device 100 in this embodiment disposes the contact metals 116 on the N-type first doped region 104 at two sides of the P-type second doped region 106 extending out from the two ends of the long axis 106a respectively, so that each Schottky diode 118 is formed at outside of each curved portion 106c of the P-type second doped region 106 respectively, Accordingly, the LDMOS device 100 in this embodiment may effectively utilize a region surrounded by the guard ring 132 without affecting the current to dispose the Schottky diode 118 so as to save the area of the device because the current of the LDMOS device 100 is determined by the straight portions 106d disposed between the N-type first doped region 104 and the N-type third doped region 110 and being regarded as the effective channel region, and the curved portions 106c disposed between the N-type first doped region 104 and the N-type third doped region 110 do not affect the current of the LDMOS device 100. Also, the LDMOS device 100 may further utilize the built-in Schottky diode 118 to raise the current of the reverse current path from the source to the drain so as to accelerate the speed of introducing the reverse source current.

The LDMOS device of the present invention is not limited to the above-mentioned embodiment. The following description continues to detail the other embodiments or modifications, and in order to simplify and show the difference between the other embodiments or modifications and the above-mentioned embodiment, the same numerals denote the same components in the following description, and the same parts are not detailed redundantly.

Figure 4:
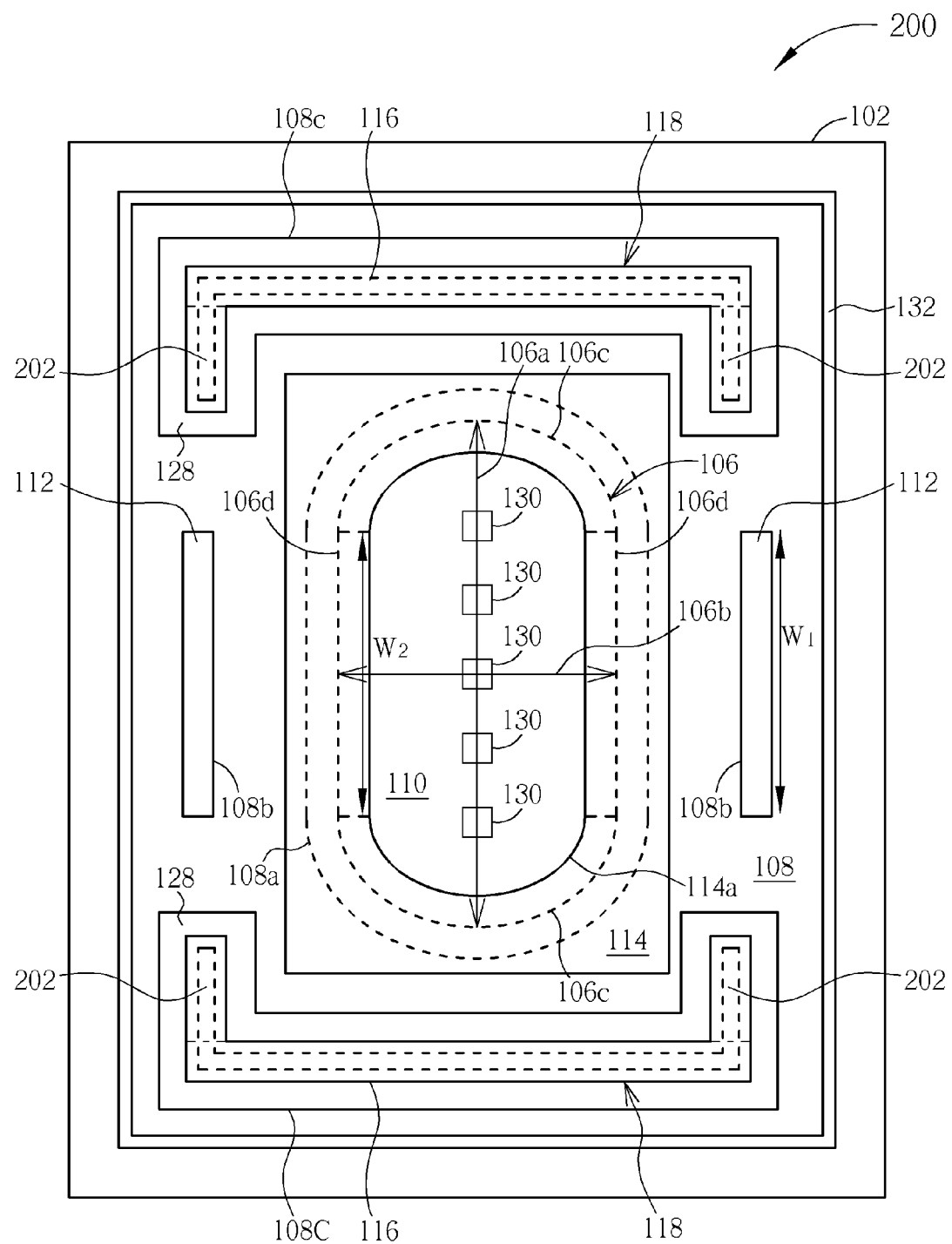
FIG. 4 is a schematic diagram illustrating a top view of an LDMOS device according to a second preferred embodiment of the present invention.

Please refer to FIG. 4. FIG. 4 is a schematic diagram illustrating a top view of an LDMOS device according to a second preferred embodiment of the present invention. As shown in FIG. 4, as compared with the first embodiment, each contact metal 116 of the LDMOS device 200 in this embodiment has two extension parts 202, respectively extending toward the two sides of the P-type second doped region 106 extending out along the short axis 106b. This means that each extension part 202 extends toward each N-type fourth doped region 112, and is not in contact with each N-type fourth doped region 112. Furthermore, the P-type fifth doped regions 128 under the contact metals 116 also may be extended toward the two sides of the P-type second doped region 106 extending out along the short axis 106b respectively. The present invention is not limited that each contact metal has the extension part and each contact metal has two extension parts, and at least one of the contact metals may have at least one extension part.

Figure 5:
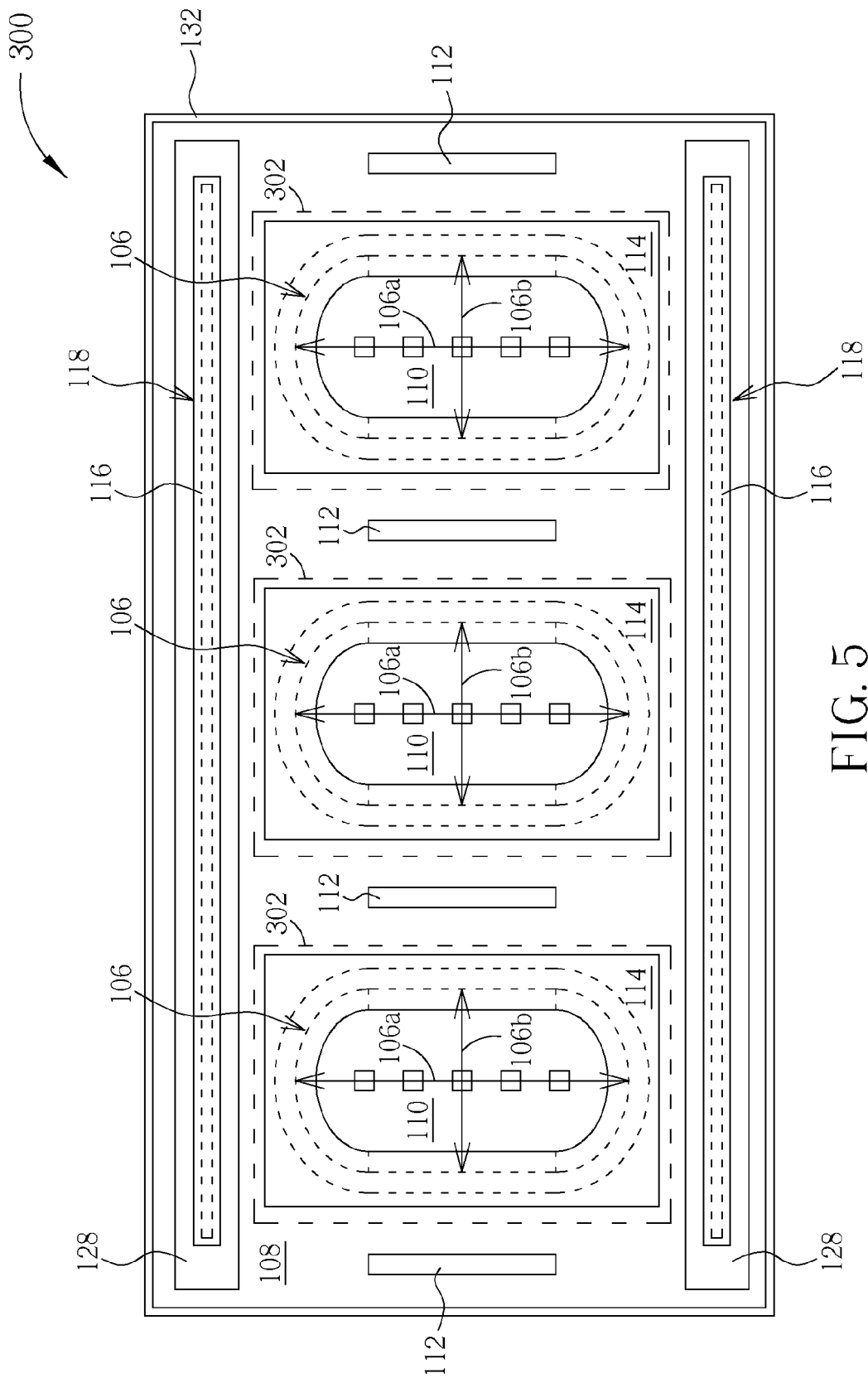
FIG. 5 is a schematic diagram illustrating a top view of an LDMOS device according to a third preferred embodiment of the present invention.

Furthermore, the LDMOS device of the present invention is not limited to have only one N-type third doped region, only one P-type second doped region and only one gate structure. Please refer to FIG. 5. FIG. 5 is a schematic diagram illustrating a top view of an LDMOS device according to a third preferred embodiment of the present invention. As shown in FIG. 5, as compared with first embodiment, the LDMOS device 300 in this embodiment includes a plurality of P-type second doped regions 106, a plurality of N-type third doped regions 110, a plurality of gate structures 114, and a plurality of N-type fourth doped regions 112. Each P-type second doped region 106, each N-type third doped region 110, each gate structure 114 and the N-type first doped region 104 constitute an LDMOS unit 302. Each Schottky diode 118 formed by each contact metal 116 being in contact with the N-type first doped region 104 may be extended along the direction parallel with the short axis 106b of each P-type second doped region 106, and a extending length of each Schottky diode 118 may be determined by the turn-on current of the LDMOS device 300. The Schottky diodes 118 are parallel with each other, and is parallel with the short axis 106b, so that the LDMOS units 302 are disposed between the Schottky diodes 118. In addition, the N-type fourth doped regions 112 are disposed at two sides of each LDMOS unit 302, and two adjacent LDMOS units 302 share the same one N-type fourth doped region 112, so each N-type fourth doped region 112 and each LDMOS unit 302 are arranged sequentially in turn along the direction parallel with the short axis 106. Furthermore, the guard ring 132 surrounds the Schottky diodes 118, the LDMOS unit 302 and the N-type fourth doped regions 112.

In summary, the LDMOS device in the present invention disposes at least one contact metal of the Schottky diode on the N-type first doped region at at least one side of the P-type second doped region extending out along the long axis to effectively utilize the region surrounded by the guard ring without affecting the current and to save the area of the LDMOS device. In addition, the LDMOS device of the present invention may further utilize the built-in Schottky diode to raise the current of the reverse current path from the source to the drain so as to accelerate the speed of introducing the reverse source current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lateral diffused metal-oxide-semiconductor (LDMOS) device, comprising:
   a substrate;
   a first doped region, disposed in the substrate, and having a first conductive type;

a second doped region, disposed in the first doped region, and having a second conductive type, wherein the second doped region has a racetrack-shaped outline, the second doped region has a long axis and a short axis, and the second doped region has a straight portion, disposed at an end of the short axis;

a third doped region, disposed in the second doped region, and having the first conductive type;

a fourth doped region, disposed in the first doped region, and having the first conductive type, wherein the fourth doped region is disposed in the first doped region at a side of the second doped region extending out along the short axis, and a width of the fourth doped region in a direction parallel with the long axis is larger than or equal to a width of the straight portion in the direction parallel with the long axis;

a gate structure, disposed on the first doped region and the second doped region between the third doped region and the fourth doped region; and a contact metal, disposed on the first doped region at a side of the second doped region extending out along the long axis, and being in contact with the first doped region.

2. The LDMOS device according to claim 1, wherein the third doped region is electrically connected to a low voltage end, and the fourth doped region is electrically connected to a high voltage end.

3. The LDMOS device according to claim 1, further comprising a fifth doped region, disposed in the first doped region under the contact metal, and being in contact with the contact metal, wherein the fifth doped region has the second conductive type.

4. The LDMOS device according to claim 1, wherein the contact metal has at least one extension part, extending out toward a side of the second doped region extending out along the short axis.

5. The LDMOS device according to claim 1, further comprising a plurality of sixth doped regions, disposed in the third doped region, and penetrating through the third doped region to be in contact with the second doped region, wherein the sixth doped regions have the second conductive type.

6. The LDMOS device according to claim 1, further comprising a guard ring, disposed in the substrate, and surrounding the first doped region.

7. The LDMOS device according to claim 1, further comprising another contact metal, disposed on the first doped region at another side of the second doped region extending out along the long axis, and being in contact with the first doped region.

8. The LDMOS device according to claim 1, wherein the gate structure surrounds the third doped region.

9. A lateral diffused metal-oxide-semiconductor (LDMOS) device, comprising:

two Schottky diodes, disposed in parallel with a direction, wherein each Schottky diode comprises a slit-shaped contact metal, and each slit-shaped contact metal extends along the direction; and a plurality of LDMOS units, disposed between the Schottky diodes, and the LDMOS units being arranged along the direction.

10. The LDMOS device according to claim 9, further comprising a guard ring, surrounding the Schottky diodes and the LDMOS units.

11. The LDMOS device according to claim 9, further comprising a plurality of doped regions, each doped region and each LDMOS unit arranged sequentially in turn along the direction.

* * * * *